United States Patent
Igarashi

Patent Number: 6,090,634
Date of Patent: Jul. 18, 2000

[54] FAILURE ANALYSIS APPARATUS OF SEMICONDUCTOR INTEGRATED CIRCUITS AND METHOD THEREOF

[75] Inventor: Kinichi Igarashi, Yamagata, Japan

[73] Assignee: NEC Corporation, Tokyo, Japan

[21] Appl. No.: 09/104,877

[22] Filed: Jun. 25, 1998

[30] Foreign Application Priority Data

Jun. 26, 1997 [JP] Japan ................................ 9-170400

[51] Int. Cl.[7] ............................ G01R 31/26; H01L 21/66
[52] U.S. Cl. ................................ 438/17; 438/14; 438/18
[58] Field of Search .................................. 438/17, 18, 14

[56] References Cited

U.S. PATENT DOCUMENTS 5,113,241  5/1992  Yanagida et al. .
5,288,664  2/1994  Mukai .
5,815,000  9/1998  Farnworth et al. .

FOREIGN PATENT DOCUMENTS 0 341 001   4/1989  European Pat. Off. .
8-37142     6/1996  Japan .

Primary Examiner—Kevin M. Picardat
Assistant Examiner—D. Mark Collins
Attorney, Agent, or Firm—Hutchins, Wheeler & Dittmar

[57] ABSTRACT

First of all, after removing a passivation film on a failure pellet area, a timing failure level of the pellet area is digitized using a tester. Then, a polyimide solution is dropped on the upper semi-circular region of the pellet area. Then, the timing failure level of the pellet after forming the polyimide film is digitized using the tester again. Thereafter, the timing failure value after forming the polyimide film and the timing failure value before forming the polyimide film is compared. Then, based on the comparison results, the region with failure is judged. Then, repeating the step of selectively forming the polyimide film on the region with failure and the step of judging the region with failure, the failure region is identified.

11 Claims, 3 Drawing Sheets

FAILURE ANALYSIS APPARATUS OF SEMICONDUCTOR INTEGRATED CIRCUITS AND METHOD THEREOF

BACKGROUND OF THE INVENTION

1. Field of the Invention

The present invention relates to a failure analysis apparatus of semiconductor integrated circuits with a timing failure and the method thereof, and more specifically, to a failure analysis apparatus of semiconductor integrated circuits and the method thereof for easily identifying the failure occurring region in a short time.

2. Description of the Related Art

Recently, as the density of wiring in the semiconductor integrated circuit increases, the floating capacitance has increased. Consequently, in the wafer sorting process for inspecting electrical characteristics of wafers with elements formed, the wafer manufacturing yield may be lowered by occurrence of a failure in the timing system. The characteristics of the timing failure, in general, is to be a failure occurring in the specific test pattern among the inspections of electrical characteristics. That is, when the passivation film on the surface is removed, the wafer is not rejected due to the test pattern with which the same wafer is rejected in the previous electrical characteristic inspection but when the passivation film is formed on the wafer again, the wafer is judged to be rejected.

This kind of the timing failure is assumed to occur by changes of floating capacitance between metal wirings used in the semiconductor integrated circuits by the existence or non-existence of the passivation film on the wafer, which, in turn, causes variations to the time constant of the circuit.

In order to analyze the nonconforming wafer with the timing failure, a capacitance is formed in the region desired to be analyzed, and how the timing is deviated must be observed. This kind of an analysis method for nonconforming wafer will be described as follows. First of all, in the test pattern in which the wafer is rejected, an engineer who is familiar with the circuit technology presumes possible failure places of wiring in the pellet area. Then, using lasers and so forth, a hole is provided on the passivation film on the possible failure place, and a probe needle is set up on the wiring presumed to be failure. Then, while confirming the signal passing through this wiring by an oscilloscope and so forth, via the probe needle, the failure is investigated. If the failure portion is able to be identified by this investigation, a capacitance electrode comprising W (tungsten) film and so forth, is formed on the region, and the capacitance is formed virtually, and failure analysis is carried out while judging whether the failure level degrades or not by the LSI tester.

However, the above failure analysis method has the following problems. The first problem is that the engineer in a mass-production plant is able to determine whether it is a timing failure or not but it is difficult for the engineer to identify the failure portion region and implement the subsequent failure analysis. This is because in order to presume a failure portion of the semiconductor integrated circuit based on the test pattern in which failure occurs, expertise both on the circuit and on the test patterns and circuit operations is essential.

The second problem is that it is extremely difficult to put up a probe needle on the wiring after a hole is provided using lasers and so forth, on the passivation film on the failure portion of the semiconductor integrated circuit based on the test pattern generating the failure. This is because the wiring width and distance between wirings of the semiconductor integrated circuit are less than 1 μm as refinement of elements further proceeds.

The third problem is that time for forming the W film takes 1 to 2 hours per region when the electrode such as W film and so forth, is provided on the region after identifying the failure portion. Consequently, to form the capacitance at several portions, for example, more than 8 hours are required. This is because the apparatus such as FIB (focused ion beam) or FLB (focused laser beam) used for forming the W film is a vacuum apparatus and needs time for evacuation. In addition, the difficulty of specifying the region for forming the capacitance causes the time for forming the W film to take long. As a result, one to two hours are required for forming the W film per region.

SUMMARY OF THE INVENTION

It is an object of the present invention to provide a failure analysis apparatus of semiconductor integrated circuits and the method thereof, which can shorten the time for identifying the timing failure generating portion in semiconductor integrated circuits, can carry out failure analysis in a short time, can thereby reduce occurrence of defective products at an early stage, and can improve the productivity.

The failure analysis apparatus of semiconductor circuits formed on a semiconductor substrate according to the present invention comprises a wafer stage for mounting said substrate, a solution dropping apparatus for dropping a solution on a part of the semiconductor substrate to form a test film whose dielectric constant is 2 to 5, a microscope arranged above the solution dropping apparatus and for enlarging the surface image of the semiconductor substrate, and a unit for moving the microscope and the solution dropping apparatus in the horizontal direction relative to the wafer stage.

This solution dropping apparatus can control a dropping amount of the solution in accordance with a dimension of a region where the solution is dropped. And the solution dropping apparatus may have a solution cartridge filled with the solution, and a needle mounted so as to pass through the solution cartridge. Thereby, the solution can be dropped on the semiconductor substrate while trickling along the needle. In this case, the diameter of the needle can be 0.1 to 1 mm. The solution may be polyimide solution.

The failure analysis method of semiconductor integrated circuits according to the present invention comprises a step of preparing a plurality of pellets having same wiring patterns and passivation film on the wiring patterns. Then, the passivation film on the pellet is removed, a timing failure of the pellet after removing the passivation film is measured and digitized, and a timing failure value before forming a test film whose dielectric constant is 2 to 5 is obtained. Then, test film is selectively formed on one pellet of a plurality of pellets after removing the passivation film. A timing failure of the pellet after forming the test film is measured and is digitized, and a timing failure value after forming the test film is obtained. Thereafter, the timing failure value before forming the test film is compared with the timing failure value after forming the test film. In this case, if the timing failure value after forming the test film is degraded, it is judged that failure exists in the test film forming region. If the timing failure value after forming the test film is not degraded, it is judged that failure exists in the test film unforming region. Thereafter, the test film is selectively formed on the region in one pellet of pellets which is not judged. The region is corresponding to the region judged to have failure by the step of comparing and judging. Then, a failure region is identified by alternately repeating the step of comparing and judging and the step of selectively forming the test film on the region in the other one pellet.

The plurality of pellets may be a plurality of pellet areas defined in one wafer. The step of selectively forming the test film on one pellet of a plurality of pellets after removing the passivation film may be a step of forming the test film on the region ½ of the surface of the one pellet. The step of selectively forming the test film on the region corresponding to the region judged to have failure may be a step of forming the test film on the region ½ of the region corresponding to the region judged to have the failure. However, these regions may not necessarily be a region strictly ½, but may be practically ½.

The pellet can have an input portion and an output portion, and the step of obtaining the timing failure value can be a step of applying voltage to the input portion and measuring a deviation between the actual voltage outputted from the output portion and an expected voltage value in terms of voltage value.

The pellet can have an input portion and an output portion, and the step of obtaining the timing failure value can be a step of inputting signals to the input portion at a predetermined timing and measuring a deviation between the actual timing of the signal outputted from the output portion and an expected timing value in terms of time. The test film may be polyimide film.

It is possible to identify the region with a failure even by using one pellet with a wiring pattern and the passivation film formed on the wiring pattern in place of a plurality of pellets. In such event, a step of removing the test film formed on the pellet is required after the step of judging the presence of the failure.

In the present invention, after selectively forming the test film on the pellet, the timing failure level is digitized with respect to the pellet after forming this test film and compared with the timing failure level of the pellet before forming the test film. And based on the compared results, a timing failure generating regions are successively identified. In this way, in the present invention, because circuit knowledge and so forth, are no longer required and the failure regions can be identified through mechanical operations, the failure generating regions can be easily identified irrespective of knowledge of operators. In the present invention, because a method for bringing the needle and so forth, in contact with the circuit is not used for a method for identifying the failure generating region, the failure generating region can be easily identified even when the wiring width and intervals between wiring are reduced with an increase in refinement of elements.

In addition, because in the present invention, the region is divided into two and repeating the two-dividing method for evaluating degradation on one region enables the formation of the test film and the digitization of the failure level in about 5 minutes per place, identification of failure regions which used to require about one day can be carried out in about 70 minutes. Consequently, the time requiring for identification of the timing failure region can be shortened to about ⅐ the prior art and it is possible to reach the failure generating region extremely easily and in an extremely short time.

DETAILED DESCRIPTION OF THE PREFERRED EMBODIMENTS

Figure 1:
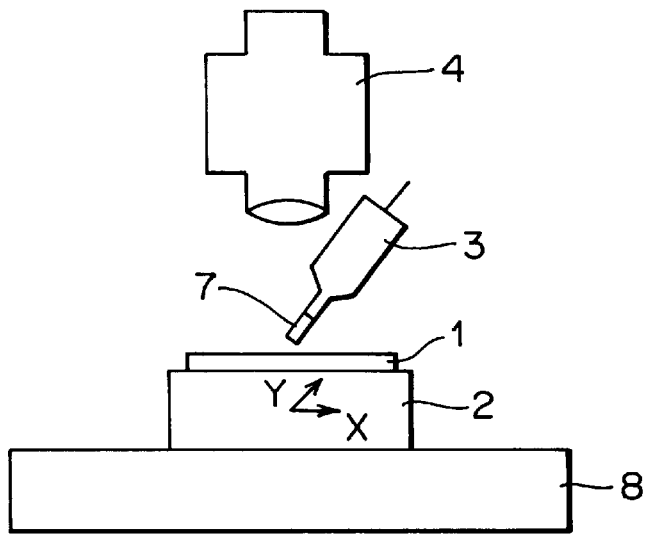
FIG. 1 is a schematic view showing a failure analysis apparatus according to the embodiment of the present invention.

Referring now to the drawings, preferred embodiments according to the invention will be described in detail hereinafter. FIG. 1 is a schematic view showing a failure analysis apparatus according to the embodiment of the present invention. As shown in FIG. 1, a wafer stage 2 on which a wafer 1 is mounted is installed to a base 8 movably in the horizontal X direction and in the horizontal Y direction which crosses the X direction at right angles. A polyimide cartridge 3 filled with the polyimide solution is positioned on the wafer stage 2. The polyimide cartridge 3 has its tip end formed slenderly and a needle 7 is installed in such a manner to pass through the cartridge 3. Consequently, by moving the needle 7 vertically, the polyimide solution in the cartridge 3 can be dropped in a specified region on the wafer 1 while allowing it to trickle along the needle 7.

In addition, a microscope 4 is arranged above the wafer stage 2, and the surface image of the wafer 1 can be enlarged for observation with this microscope 4.

The wafer stage 2 can mount the wafer 1 with 125 to 300 mm in diameter. In addition, the polyimide solution can be dropped to a desired region in a desired pellet area in the wafer 1 using the microscope 4, and it is thereby possible to form the polyimide film in a desired region on the wafer 1.

The diameter of the needle 7 is preferably 0.1 through 1 mm. In order to drop the polyimide solution in a wide region more than 10 mm$^2$, the diameter of the needle 7 is preferably about 1 mm. On the other hand, in order to drop the polyimide solution in an extremely narrow region about several $\mu$m$^2$ on the wafer 1, the diameter of the needle 7 is preferably about 0.1 mm. However, the use of the polyimide cartridge 3 with the needle 7 about 0.5 mm in diameter installed can select the application region within the range from about 400 $\mu$m$^2$ to 1 mm$^2$.

In the embodiment shown in FIG. 1, the polyimide cartridge 3 with the needle 7 equipped is used for an apparatus for dropping the polyimide solution on the wafer 1, but the present invention shall not be limited to this, but for example, an apparatus which can spout traces of polyimide solution such as an injector may be used.

Figure 2A:
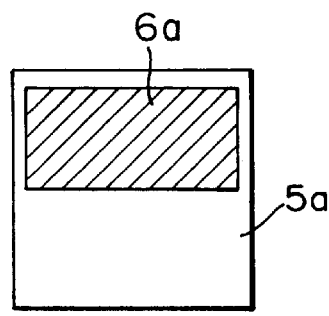
FIGS. 2A through 2F are schematic views showing processes for identifying failure places in order of process in a failure analysis method according to the first embodiment of the present invention.
Figure 2B:
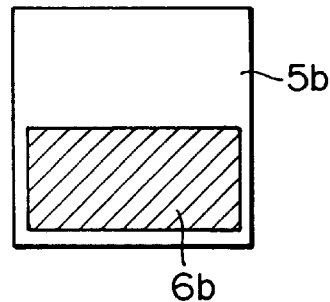
Figure 2C:
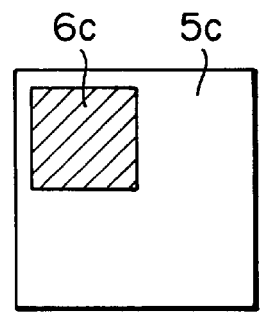
Figure 2D:
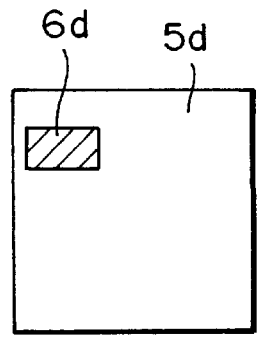
Figure 2E:
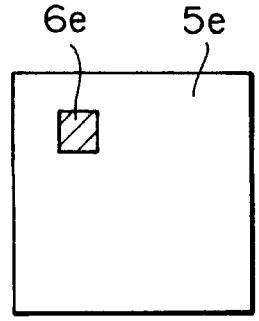
Figure 2F:
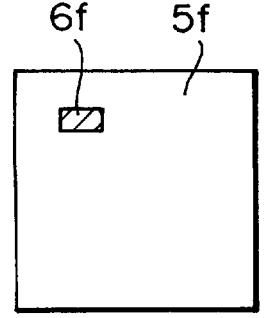
Figure 3:
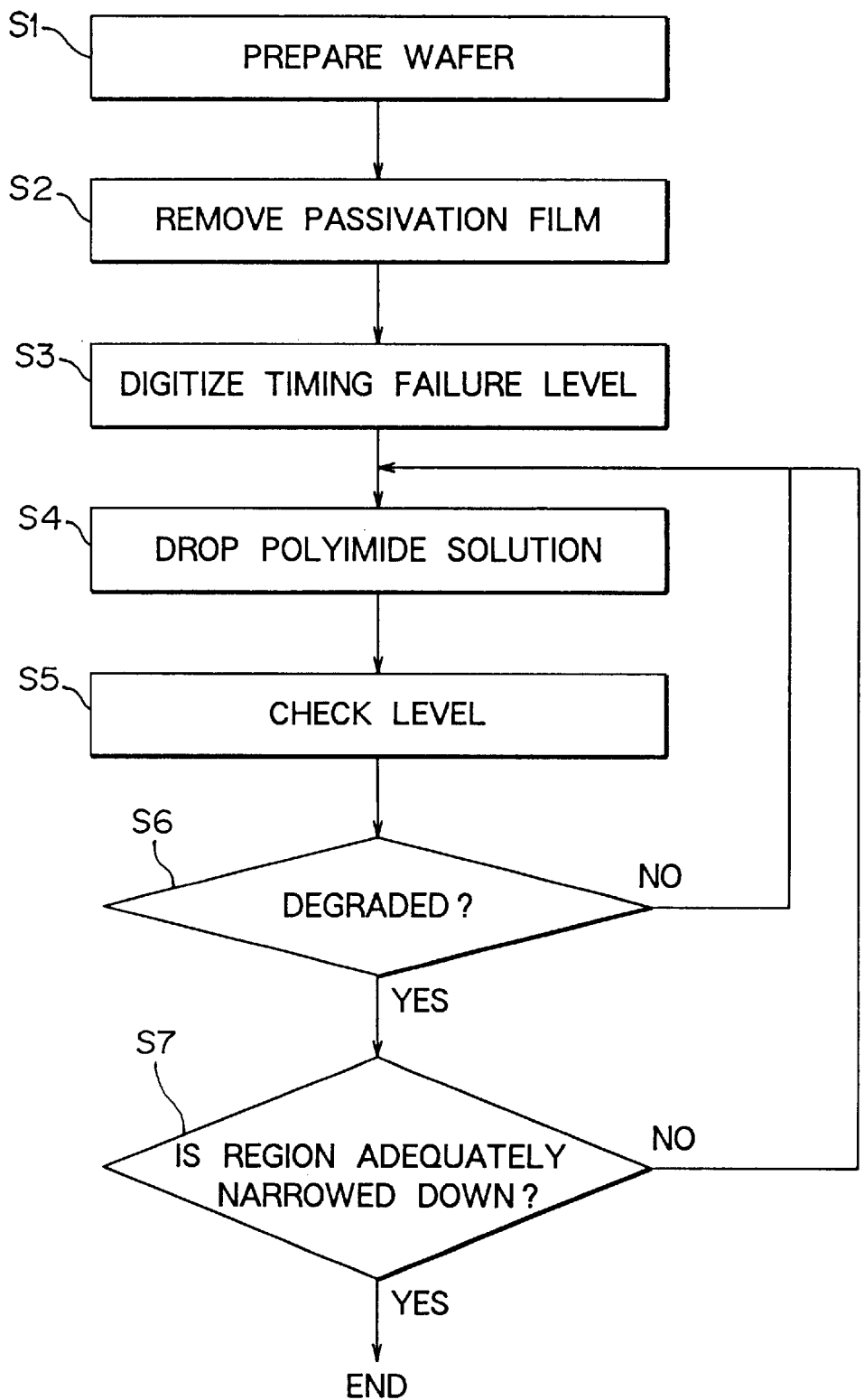
FIG. 3 is a flow chart showing the failure analysis method according to the first embodiment of the present invention.

Next description will be made as follows on the failure analysis method using the failure analysis apparatus for semiconductor integrated circuits shown in FIG. 1. FIGS. 2A through 2F are schematic views showing the process for identifying failure places in order of processes in the failure analysis method according to the first embodiment of the present invention, while FIG. 3 is a flow chart showing the failure analysis method according to the first embodiment of the present invention. In FIGS. 2A through 2F, the region for forming the polyimide film for identifying the failure generating regions in the wafer 1 is shown with slash lines. In order to analyze timing failure, it is necessary to form the capacitance in the region only on which an analysis is desired and to observe how the timing is deviated.

Therefore, the method for identifying the position on which the capacitance is formed, that is, the timing failure generating position will be described as follows.

First of all, in the wafer 1 in which timing failure occurs, about 20 failure pellet areas with the same test pattern formed are prepared (step S1). Then, the passivation film on the failure pellet area is removed (step S2). Then, while recording the address on the wafer, the timing failure levels of all pellet areas 5a through 5f are digitized by an LSI tester (step S3). For the numerical value showing this failure level, voltage or time, or others may be used, and a digitizing method suited for the test is allowed to be used.

For a method for digitizing the timing failure level, for example, there is a method for entering voltage of various values in the input portion of the pellet and measuring with an LSI tester to ensure whether the expected voltage value can be obtained from the output portion. The use of this method allows the deviation from the expected value (voltage value) to be regarded as the failure level. In addition, there is also a method for entering signals into the input portion of the pellet at various types of timing and to measure with an LSI tester to ensure whether the signal is outputted from the output portion at a desired timing. In this case, the deviation from the expected value (time) can be designated to the failure level.

When a plurality of failure generating regions are detected in one pellet area, first of all, the failure generating region which has the greatest effect on the yield is identified to analyze the failure, and the next failure generating region is identified as required. In order to specify the failure generating region in the pellet area of the wafer 1, after setting the wafer 1 on the wafer stage 2, for example, as shown in FIG. 2A or FIG. 2B, a desired amount of polyimide solution is dropped on the upper semi-circular region 6a or lower semi-circular region 6b of the pellet area 5a or pellet area 5b using the polyimide cartridge 3 and so forth (step S4). At the time, since the wafer stage 2 is installed movably in the horizontal direction to the base 8, the polyimide solution dropping region can be strictly adjusted by moving the wafer stage 2 while observing the wafer 1 surface with the microscope 4. Then, again, using the tester, the timing failure level of the pellet after forming the polyimide film is digitized (step 5).

Thereafter, for example, comparison is made for the upper semi-circular region 6a of the pellet area 5a to ensure that the timing failure level after forming the polyimide film is degraded from the timing failure level before forming the polyimide film (step S6). In this way, dropping the polyimide solution between metal wirings on the pellet area can vary the capacitance only between desired wirings. Consequently, it is possible to judge whether the polyimide film forming region has failure or not by comparing the timing failure level of the pellet after forming the polyimide film with the timing failure level before forming the polyimide film.

For example, if the timing failure level of the pellet after forming the polyimide film is not degraded as compared to that before forming the polyimide film in step S6, there is a case in which the polyimide film forming region does not contain the failure region. Consequently, return to step S4, selectively drop the polyimide solution to the region excluding the upper semi-circular region 6a and carry out the similar evaluation.

If comparison results of step S6 indicate that the timing failure level of the pellet with the polyimide film formed on the upper semi-circular region 6a is degraded, there is a case in which the upper semi-circular region 6a contains a failure region, and therefore, judge whether the region is sufficiently identified (step S7). In this step S7, if it is judged that identification of the failure generating region is not sufficient, return to step S4. That is, as shown in FIG. 2C, in the next pellet area 5c, drop the polyimide solution on the region 6c one half the upper semi-circular region. Thereafter, in the same manner, carry out evaluation of step S6 and judgment of step S7 and evaluate failure of regions 6d, 6e, and 6f on pellet areas 5d, 5e, and 5f shown in FIG. 2D through FIG. 2F until the failure generating region can be adequately narrowed down.

Dividing the region into two portions and repeating the two-dividing method for evaluating degradation in one region in this way can reach the failure generating region extremely easily and in an extremely short time. For example, if samples of about 20 pellet areas are prepared, it is possible to focus the failure generating region to 30 $\mu m^2$ for pellets about 16 $mm^2$ in size. When a rectangle pellet area with one side 2 mm long is selected, it is possible to identify the failure generating region to about 30 $\mu m^2$ region by 17 evaluation processes using 17 pellet areas. In this event, because the time required for dropping the polyimide solution is about 1 to 3 minutes per place and the test time is several seconds, and about 2 minutes are required for wafer loading and probing to the tester, it is possible to identify the failure region in about 70 minutes.

After identifying the failure generating region, the capacitance electrode consisting of the W film and so forth, is formed on the failure generating region to form the capacitance virtually, and whether the failure level is degraded or not is judged by an LSI tester to identify the failure position.

Figure 4:
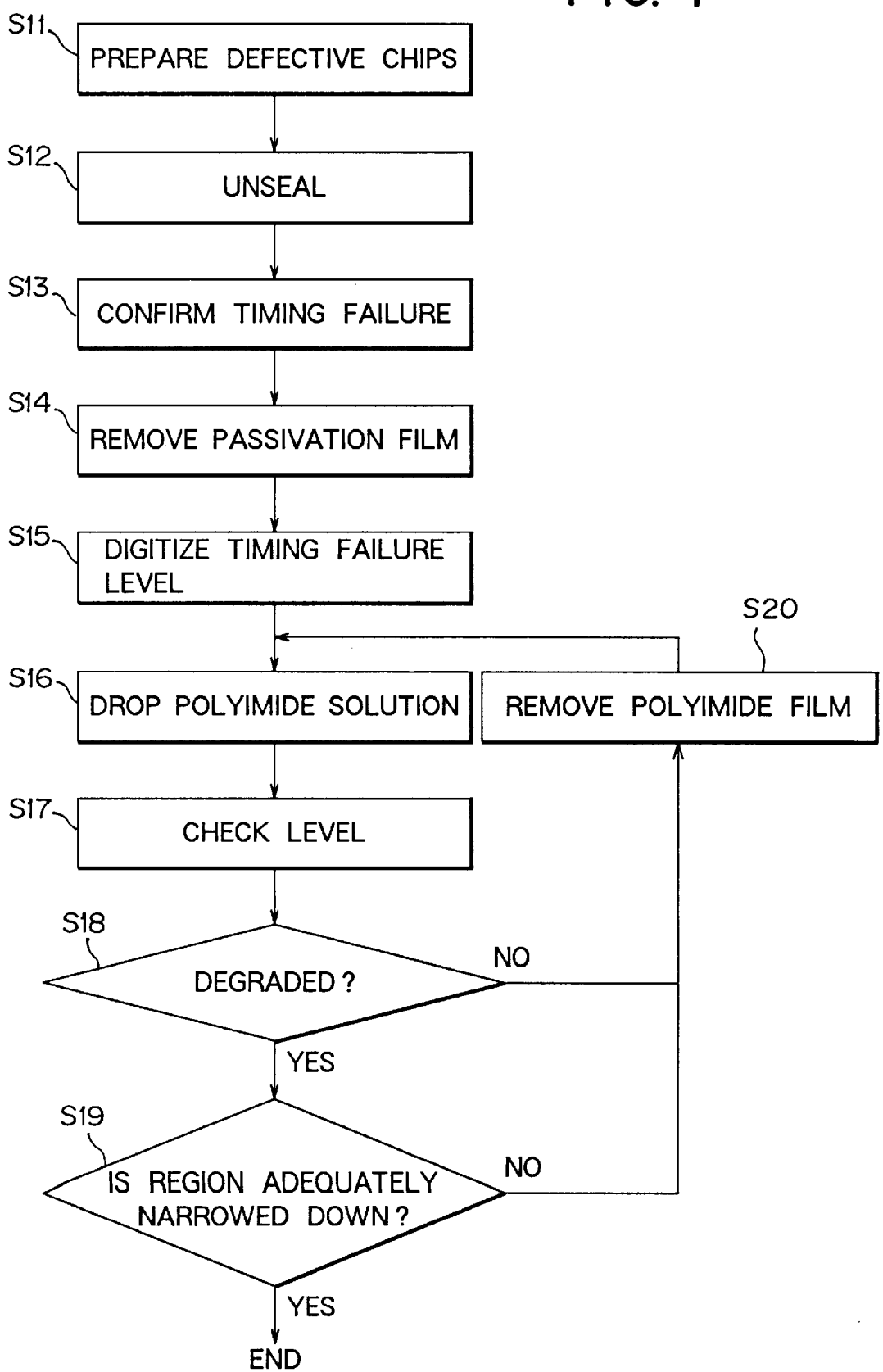
FIG. 4 is a flow chart showing a failure analysis method according to the second embodiment of the present invention.

FIG. 4 is a flow chart indicating a failure analysis method according to the second embodiment of the present invention. When only one to two pellet areas (chip) are prepared for samples in which timing failure occurrence is confirmed, it is unable to form the polyimide film successively on a plurality of samples (pellet areas) as shown in the first embodiment. Therefore, in this embodiment, after removing the polyimide film formed, the polyimide film is formed again. This process is described in detail as follows.

First of all, prepare a defective chip (step S11), and unseal this defective chip (step S12). And make sure timing failure occurs in the unsealed chip (step S13). Then, remove the passivation film on the defective chip surface (step S14). Thereafter, for the chip with the passivation film removed, check and digitize the timing failure level (step S15).

Then, as shown in FIG. 2A or FIG. 2B, drop the polyimide solution on the upper semi-circular region or the lower semi-circular region of the pellet area (step S16). Then, using a tester and so forth, digitize the timing failure level of the pellet after forming the polyimide film (step S17).

Thereafter, same as in the case of the first embodiment, compare whether the timing failure level after forming the polyimide film is degraded from the timing failure level before forming the polyimide film (step S18). In step S18, because when degradation is not confirmed, it means that the polyimide film forming region does not contain a failure region, return to step S16 after removing the polyimide film formed (step S20).

On the other hand, if it is confirmed that the polyimide film forming region contains a failure region as a result of comparison of step S18, judge whether the failure generating region is adequately identified (step S19). If the failure generating region is not adequately identified, after removing the polyimide film (step S20), return to step S16 after removing the polyimide film formed.

After identifying the failure generating region in this way, same as in the case of the first embodiment, carry out the failure analysis.

In the second embodiment, because the polyimide film is again formed and the failure region is identified after removing the polyimide film formed, even if the quantity of samples, that is, only one defective pellet is able to be prepared, the failure region can be easily identified. For the apparatus for removing the polyimide film, an oxygen plasma apparatus may be used. If an oxygen plasma apparatus used for removing the photoresist film is adopted for a manufacturing process of the semiconductor apparatus, there is no need for preparing an apparatus newly. In addition, for example, when a 1-kW type oxygen plasma apparatus is used, the polyimide film can be removed within one minute, and it will not take longer time for identifying the failure region.

In the first and the second embodiments, the failure region is identified by judging whether there exists a failure region in the polyimide film forming region, but the present invention is not limited to the polyimide film. For example, if a test film whose dielectric constant is 2 through 5, the failure region is able to be identified in the same way as in the case of the above-mentioned embodiments. However, because the polyimide film is the one conventionally used in the manufacturing process of semiconductor device, the use of the polyimide film eliminates the need for preparing any special material.

What is claimed is:

1. A failure analysis method of semiconductor integrated circuits, comprising the steps of:
   preparing a plurality of pellets having same wiring patterns and passivation film formed on said wiring patterns;
   removing said passivation film on said pellet;
   measuring and digitizing timing failure of said pellet after removing said passivation film to obtain a timing failure value before forming a test film whose dielectric constant is 2 to 5;
   selectively forming said test film on one pellet of a plurality of pellets after removing said passivation film;
   measuring and digitizing timing failure of said pellet after forming said test film to obtain a timing failure value after forming said test film;
   comparing said timing failure value before forming said test film with said timing failure value after forming said test film and judging that failure exists in said test film forming region if said timing failure value after forming said test film is degraded and that failure exists in said test film unforming region if said timing failure value after forming said test film is not degraded;
   selectively forming said test film on a region in one pellet of pellets which is not judged, said region corresponding to the region judged to have failure by said step of comparing and judging; and
   identifying a failure region by alternately repeating said step of comparing and judging and said step of selectively forming said test film on said region in the other one pellet.

2. A failure analysis method according to claim 1, wherein said plurality of pellets are a plurality of pellet areas defined in one wafer.

3. A failure analysis method according to claim 1, wherein said step of selectively forming said test film on one pellet of said plurality of pellets after removing said passivation film is a step of forming said test film on the region ½ of the surface of said one pellet, and
   said step of selectively forming said test film on said region corresponding to the region judged to have failure is a step of forming said test film on the region ½ of the region corresponding to said region judged to have said failure.

4. A failure analysis method according to claim 1, wherein said pellet has an input portion and an output portion, and said step of obtaining said timing failure value is a step of applying voltage to said input portion and measuring a deviation between the actual voltage outputted from said output portion and an expected voltage value in terms of voltage value.

5. A failure analysis method according to claim 1, wherein said pellet has an input portion and an output portion, and said step of obtaining said timing failure value is a step of inputting signals to said input portion at a predetermined timing and measuring a deviation between the actual timing of the signal outputted from said output portion and an expected timing value in terms of time.

6. A failure analysis method according to claim 1, wherein said test film is polyimide film.

7. A failure analysis method of semiconductor integrated circuits, comprising the steps of:
   preparing a pellet provided having wiring patterns and passivation film formed on said wiring patterns;
   removing said passivation film on said pellet;
   measuring and digitizing timing failure of said pellet after removing said passivation film to obtain a timing failure value before forming said test film whose dielectric constant is 2 to 5;
   selectively forming said test film on said pellet after removing said passivation film;
   measuring and digitizing timing failure of said pellet after forming said test film to obtain a timing failure value after forming said test film;
   comparing said timing failure value before forming said test film with said timing failure value after forming said test film and judging that a failure exists in said test film forming region if said timing failure value after forming said test film is degraded and that a failure exists in said test film unforming region if said timing failure value after forming said test film is not degraded;
   removing said test film on said pellet;
   selectively forming said test film on a region in said pellet, said region corresponding to the region judged to have failure by said step of comparing and judging; and
   identifying a failure region by repeating said step of comparing and judging, said step of removing said test film and said step of selectively forming said test film on said region in said pellet.

8. A failure analysis method according to claim 7, wherein said step of selectively forming said test film on said pellet after removing said passivation film is a step of forming said test film on the region ½ of the surface of said pellet, and
   said step of selectively forming said test film on the region corresponding to the region judged to have failure is a step of forming said test film on the region ½ of said region judged to have said failure.

9. A failure analysis method according to claim 7, wherein said pellet has an input portion and an output portion, and said step of obtaining said timing failure value is a step of applying voltage to said input portion and measuring a deviation between the actual voltage outputted from said output portion and an expected voltage value in terms of voltage value.

10. A failure analysis method according to claim 7, wherein said pellet has an input portion and an output portion, and said step of obtaining said timing failure value is a step of inputting signals to said input portion at a predetermined timing and measuring a deviation between the actual timing of the signal outputted from said output portion and an expected timing value in terms of time.

11. A failure analysis method according to claim 7, wherein said test film is polyimide film.

* * * * *